(12) United States Patent
Kawai (10) Patent No.: US 8,145,174 B2
(45) Date of Patent: Mar. 27, 2012

(54) ORTHOGONAL CROSS POLARIZATION INTERFERENCE COMPENSATING DEVICE, DEMODULATOR, RECEIVING STATION, AND METHOD OF COMPENSATING CROSS-POLARIZATION INTERFERENCE

(75) Inventor: Masahiro Kawai, Tokyo (JP)

(73) Assignee: NEC Corporation, Tokyo (JP)

( * ) Notice: Subject to any disclaimer, the term of this patent is extended or adjusted under 35 U.S.C. 154(b) by 269 days.

(21) Appl. No.: 12/595,319

(22) PCT Filed: Apr. 9, 2008

(86) PCT No.: PCT/JP2008/056988
§ 371 (c)(1),
(2), (4) Date: Jan. 25, 2010

(87) PCT Pub. No.: WO2008/126852
PCT Pub. Date: Oct. 23, 2008

(65) Prior Publication Data
US 2010/0136916 A1  Jun. 3, 2010

(30) Foreign Application Priority Data
Apr. 11, 2007  (JP) .................................. 2007-103900

(51) Int. Cl.
H04B 1/06 (2006.01)
H04K 3/00 (2006.01)

(52) U.S. Cl. .................. 455/278.1; 455/276.1; 455/296; 375/347; 375/349

(58) Field of Classification Search ............... 455/276.1, 455/278.1, 296; 375/346, 347, 349
See application file for complete search history.

(56) References Cited

U.S. PATENT DOCUMENTS
4,479,258 A *  10/1984  Namiki .......................... 455/295
5,920,595 A   7/1999  Iwamatsu
6,236,263 B1 *  5/2001  Iwamatsu ....................... 329/306
7,925,236 B2 *  4/2011  Kawai ............................ 455/295

FOREIGN PATENT DOCUMENTS
| JP | 02-084834 | 3/1990 |
|---|---|---|
| JP | 03-248643 | 11/1991 |
| JP | 06-181464 | 6/1994 |
| JP | 07-177123 | 7/1995 |
| JP | 09-051296 | 2/1997 |
| JP | 2000-165339 | 6/2000 |
| JP | 2002-158630 | 5/2002 |

OTHER PUBLICATIONS

International Search Report—PCT/JP2008/056988—Jun. 3, 2008.

* cited by examiner

*Primary Examiner* — Lee Nguyen
(74) *Attorney, Agent, or Firm* — Young & Thompson (57) ABSTRACT

An orthogonal cross-polarization interference compensating device for solving the problem in which integration contents of an integration circuit are indefinite when a control loop is cut. An orthogonal cross-polarization interference compensator generates a compensation signal for compensating phase noise included in an own polarization signal. A demodulator compensates for orthogonal cross-polarization interference based on the compensation signal for the phase noise included in the own polarization signal. An error detector generates an error signal indicating phase difference between the own polarization signal compensated by the demodulator and a proper own polarization signal. A phase noise phase detector generates a differential signal indicating phase difference between the own polarization signal and other polarization signals based on the compensation signal and the error signal. An integration circuit integrates the differential signal and generates an integration signal. An infinite phase-shifter adjusts the compensation signal based on the integration signal. A control circuit determines whether or not orthogonal cross-polarization interference is present based on the compensation signal adjusted by the infinite phase-shifter, and adjusts the integration value indicated by the integration signal to be a predetermined value when there is no orthogonal cross-polarization interference.

13 Claims, 6 Drawing Sheets

$e = 2I \cdot \sin(\theta/2)$

ORTHOGONAL CROSS POLARIZATION INTERFERENCE COMPENSATING DEVICE, DEMODULATOR, RECEIVING STATION, AND METHOD OF COMPENSATING CROSS-POLARIZATION INTERFERENCE

TECHNICAL FIELD

The present invention relates to an orthogonal cross-polarization interference compensating device or a cross-polarization interference canceller (XPIC), a demodulator, a receiving station, and a method of compensating cross-polarization interference, and more particularly, relates to an orthogonal cross-polarization interference compensating device or a cross-polarization interference canceller (XPIC), a demodulator, a receiving station, and a method of compensating cross-polarization interference, which uses co-channel transmission in a wireless communication device.

BACKGROUND ART

Recently, wireless communication devices are using a co-channel transmission mode, in which different pieces of information are sent on two polarization signals that have the same frequency and different phases. The two polarization signals are referred to as a vertical polarization signal and a horizontal polarization signal and are sometimes referred to as V polarization signal and an H polarization signal. Interference may occur between the V polarization signal and the H polarization signal, which is referred to as orthogonal cross-polarization interference or cross-polarization interference. Accordingly, the wireless communication devices that use a co-channel transmission mode are provided with an orthogonal cross-polarization interference compensator, which compensates for orthogonal cross-polarization interference.

In order to compensate for orthogonal cross-polarization interference by using the orthogonal cross-polarization interference compensator, it is required to synchronize other polarization components (i.e., interfering components), which interfere with an own polarization, with carrier components (i.e., a carrier frequency) of the other polarization components, which are being input to the orthogonal cross-polarization interference compensator as a reference signal. In the case of synchronizing these components, receive local synchronization in which receiving local signals are synchronized to respective polarization signals is appropriate in sub-synchronous detection mode.

Receive local synchronization includes local division and reference synchronization. In local division, one output signal from a RF oscillator is divided into two signals, each of which is a local signal of a respective polarization signal. In addition, in reference synchronization, local oscillators are provided for respective polarization signals, and output signals from the local oscillators are used as local signals of the polarization signals, respectively, after being synchronized to one reference signal.

In local division, since the local signals of the polarization signals are the same signal, the other polarization signal component, which interferes with the own polarization signal, is completely synchronous with the carrier component (i.e., the reference signal) of the other polarization signal, which is input to the orthogonal cross-polarization interference compensator. Thus, phase noise of the local oscillator does not influence the compensation characteristics of the orthogonal cross-polarization interference compensator. However, local division is disadvantageous in terms of the reliability of the communication path since both polarization signals are disconnected if the local oscillator is broken.

In reference synchronization, even if one oscillator is broken, one communication path is ensured when the other oscillator is operating. In this mode there is improved in the reliability of communication path over local division. In addition, in reference synchronization, since the output signals of the local oscillators are synchronous to one reference signal, the frequency of the other polarization signal is consistent with that of the own polarization signal.

However, since phase noise from one oscillator is not related to that from the other oscillator, a phase difference originating from phase noise occurs between the other polarization component, which interferes with its own polarization, and the carrier component of the other polarization component, which is input to the orthogonal cross-polarization interference compensator. When the phase difference or a changing rate of the phase difference increases, the input/output characteristics of the orthogonal cross-polarization interference compensator degrade.

Figure 1:
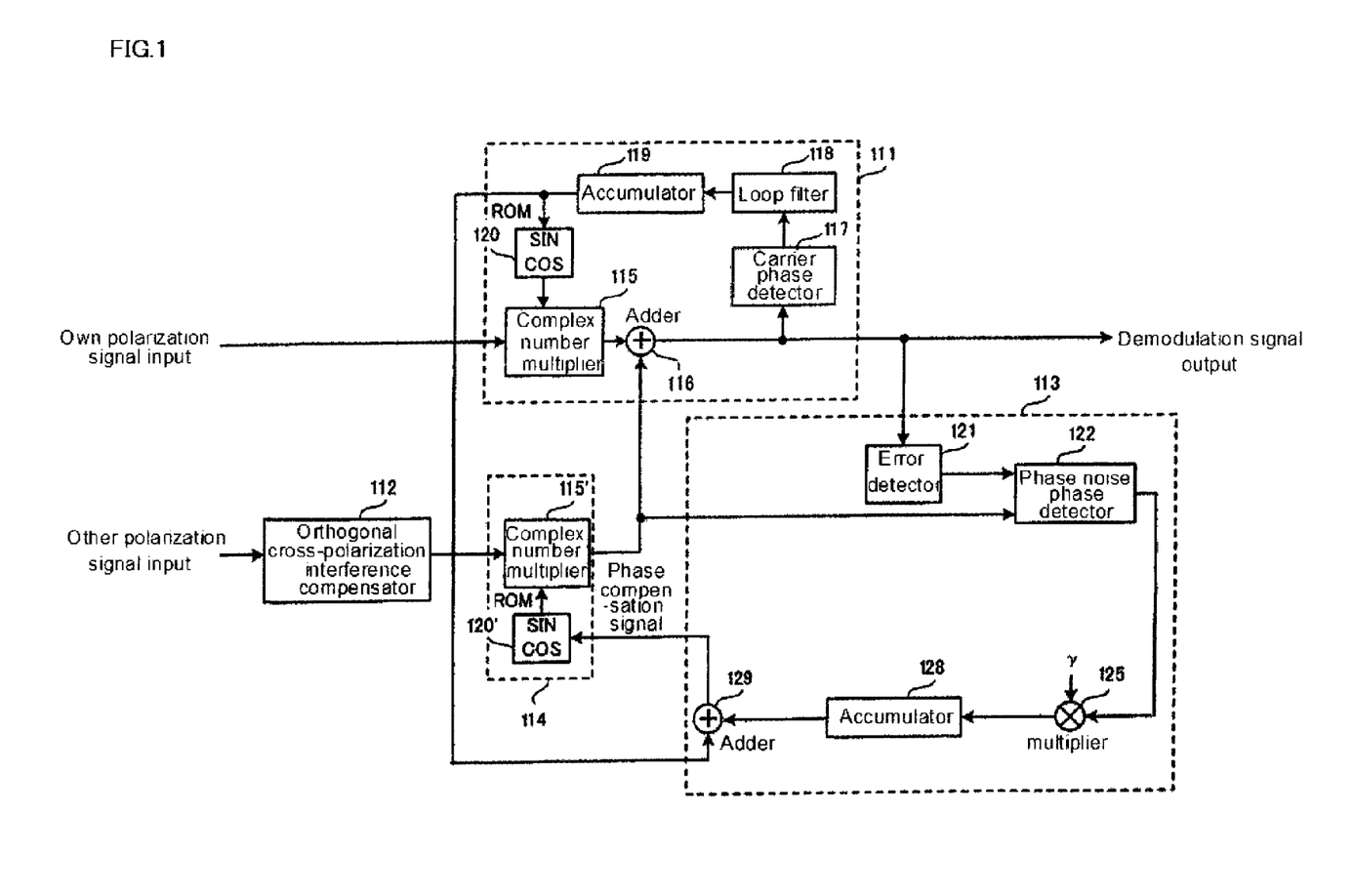
FIG. 1 is a block diagram illustrating the configuration of an orthogonal cross-polarization interference compensating device (i.e., a first control loop) of the related art.

A phase corrector capable of suppressing the phase difference originating from phase noise is phase corrector 113 as shown in FIG. 1. Phase corrector 113 detects a phase difference between a local signal of own polarization input and a local signal of other polarization input based on an error signal, which is obtained from the result of demodulating an output signal of orthogonal cross-polarization interference compensator 112 and a main signal (i.e., an own polarization input). In addition, phase corrector 113 suppresses the phase difference originating from phase noise by adjusting the phase of the output signal of orthogonal cross-polarization interference compensator 12 based on the phase difference.

This technology is disclosed in Patent Document 1.

Patent Document 1: Japanese Patent Publication No. 2000-165339

DISCLOSURE OF THE INVENTION

Problem to be Solved by the Invention

Phase corrector 113 shown in FIG. 1 compensates for influence of phase noise on the output signal of orthogonal cross-polarization interference compensator 112 by forming a first control loop. Compensation ability and the degree of freedom to set parameters can be increased using a second control loop. However, the second control loop is in a disconnected state in a normal state where no orthogonal is cross-polarization interference is present. In the second control loop, since an integration circuit is enclosed inside the loop, the result of integration of the integration circuit becomes indefinite when the control loop is disconnected. Although the second or higher control loop is preferable in terms of controlling ability and the degree of freedom to select parameters, the first loop is used so far due to the above-described problems.

An object of the invention is to provide an orthogonal cross-polarization interference compensating for device, a demodulator, a receiving station, and a method of compensating orthogonal cross-polarization interference, which can solve the foregoing problem with the related art in that the result of integration of the integration circuit becomes indefinite when the control loop is disconnected.

Means for Solving the Problem

In an aspect of the invention, the orthogonal cross-polarization interference compensating device, which compensates for orthogonal cross-polarization interference of other polarization signals with an own polarization signal, may include a compensator that generates a compensation signal for compensating for phase noise included in its own polarization signal; a demodulator that compensates for the orthogonal cross-polarization interference of the other polarization signals with the own polarization signal by suppressing phase noise included in the own polarization signal based on the compensation signal; an error detector that generates an error signal that indicates a phase difference between own polarization signal compensated by the demodulator and a proper own polarization signal; a phase detector that generates a differential signal that indicates a phase difference between own polarization signal and the other polarization signals based on the compensation signal and the error signal; an integrator that generates an integration signal by integrating the differential signal generated by is phase detector; a shifter that adjusts the compensation signal based on the integration signal generated by the integrator; and a controller that determines whether or not orthogonal cross-polarization interference is present based on the compensation signal adjusted by the shifter, and if no orthogonal cross-polarization interference is present, adjusts the integration value that is indicated by the integration signal to a predetermined value.

In another aspect of the invention, the demodulator may include the orthogonal cross-polarization interference compensating device as above; a first oscillator generating a first local signal; a first multiplier generating an own polarization baseband signal by mixing the first local signal, generated by the first oscillator, with an own polarization signal intermediate signal and inputting the own polarization baseband signal, as the own polarization signal, to the orthogonal cross-polarization interference compensating device; and a second multiplier generating other polarization baseband signals by mixing the first local signal, generated by the first oscillator, with other polarization intermediate frequency signals and inputting the other polarization baseband signals, as the other polarization signals, to the orthogonal cross-polarization interference compensating device.

In a further aspect of the invention, the receiving station may include the demodulator as described above; a reference oscillator generating a reference signal; a second oscillator generating a second local signal synchronous with the reference signal generated by the reference oscillator; a third oscillator generating a third local signal synchronous with the reference signal generated by the reference oscillator; a third multiplier generating the own polarization intermediate frequency signal by mixing the second local signal, generated by the second oscillator, with an own polarization radio frequency signal; and a third multiplier generating the other polarization intermediate frequency signals by mixing the third local signal, generated by the third oscillator, with other polarization radio frequency signals.

In yet another aspect of the invention, the method of compensating for orthogonal cross-polarization interference, which compensates for orthogonal cross-polarization interference of other polarization signals with an own polarization signal, may include steps of: generating a compensation signal for compensating for phase noise included in the own polarization signal; compensating the orthogonal cross-polarization interference of the other polarization signals with the own polarization signal by suppressing phase noise included in the own polarization signal based on the compensation signal; generating an error signal indicates a phase difference between the compensated own polarization signal and a proper own polarization signal; generating a differential signal indicating phase difference between the own polarization signal and the other polarization signals based on the compensation signal and the error signal; generating an integration signal by integrating the generated differential signal; adjusting the compensation signal based on the generated integration signal; and determining whether or not orthogonal cross-polarization interference is present based on the adjusted compensation signal, and if no orthogonal cross-polarization interference is present, adjusting the integration value that is indicated by the integration signal to a predetermined value.

EFFECT OF THE INVENTION

According to the present invention, it is possible to solve the foregoing problem with the related art in which the result of integration of the integration circuit becomes indefinite when the control loop is disconnected.

BEST MODE FOR CARRYING OUT THE INVENTION

Exemplary embodiments of the invention will now be described hereinafter with reference to FIGS. 2 through 10.

First Exemplary Embodiment

Figure 2:
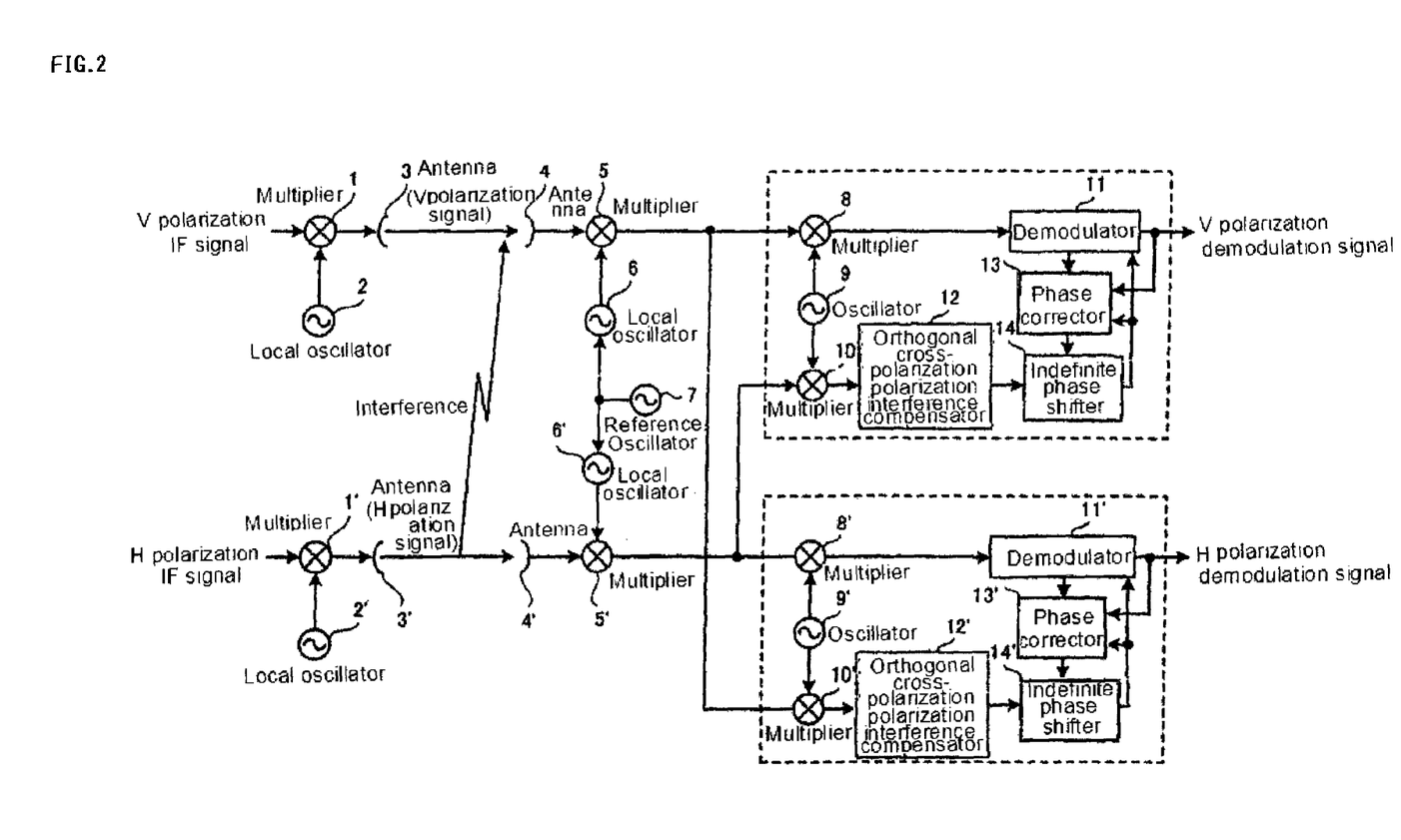
FIG. 2 is an illustration of co-channel transmission in accordance with a first exemplary embodiment of the invention.
Figure 3:
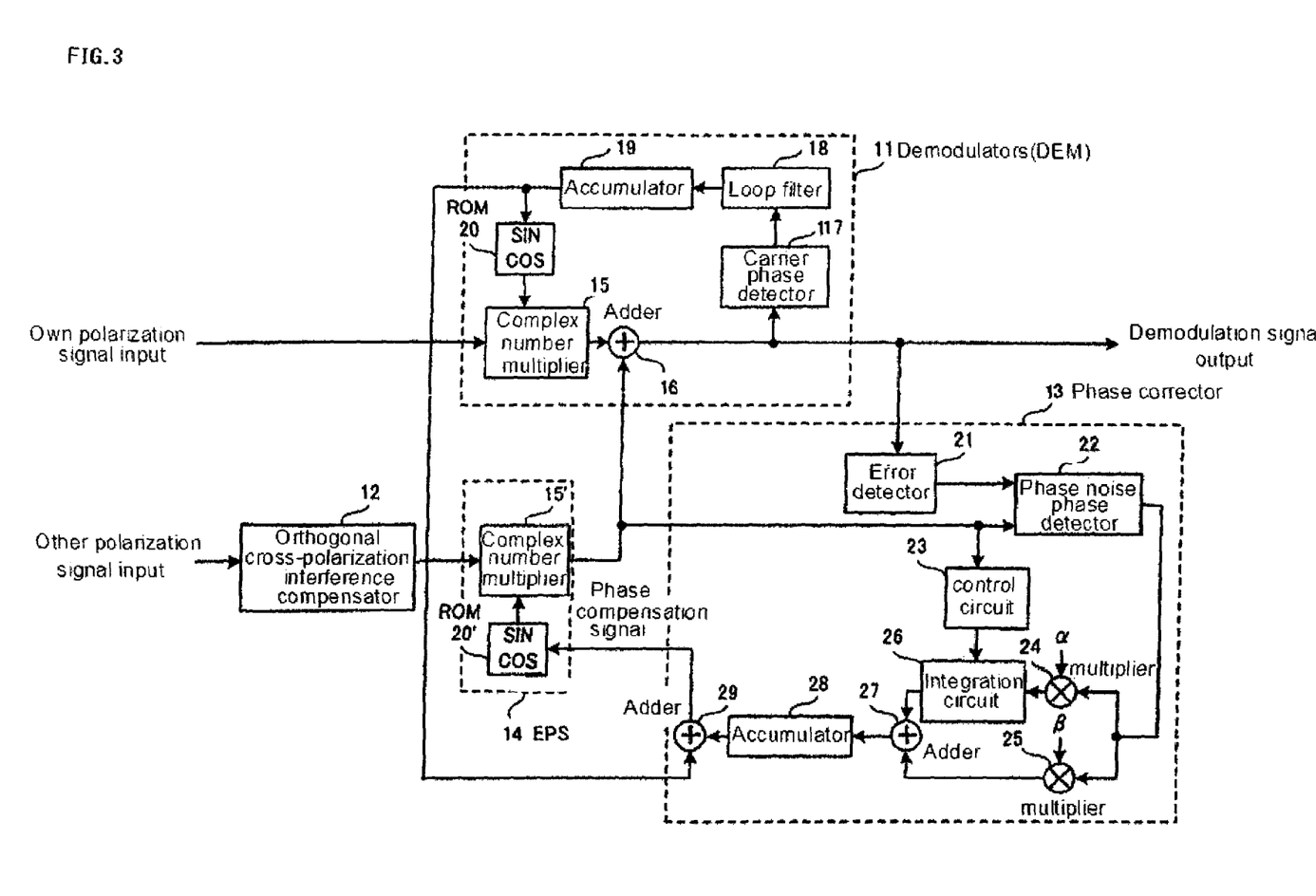
FIG. 3 is a block diagram illustrating the configuration of an orthogonal cross-polarization interference compensating device (i.e., a second control loop) in accordance with the first exemplary embodiment of the invention.

FIG. 2 is an illustration of co-channel transmission in accordance with a first exemplary embodiment of the invention, and FIG. 3 is a block diagram illustrating the configuration of an orthogonal cross-polarization interference compensating device in accordance with the first exemplary embodiment of the invention. Referring to FIG. 3, the orthogonal cross-polarization interference compensating device includes demodulator 11, orthogonal cross-polarization interference compensator 12, phase corrector 13, and infinite phase shifter 14.

The orthogonal cross-polarization interference compensating device of this exemplary embodiment will be described more fully hereinafter.

Orthogonal cross-polarization interference compensator 12 generates a compensation signal for compensating for phase noise included in an own polarization signal (i.e., an own polarization input). Demodulator 11 compensates an orthogonal cross-polarization interference of other polarization signals for its own polarization signal by suppressing the phase noise of its own polarization signal based on the compensation signal generated by orthogonal cross-polarization interference compensator 12.

Error detector 21 of phase compensator 13 generates an error signal indicating a phase difference between the own polarization signal compensated by demodulator 11 and a proper own polarization signal. Phase noise-phase detector 22 generates a differential signal indicating a phase difference between the own polarization signal and other polarization signals based on the compensation signal and the error signal. Meanwhile, the phase difference originates from the phase noise of the own polarization signal and of the other polarization signals. Integration circuit 26 generates the differential signal by integrating the differential signal generated by Phase noise-phase detector 22. Infinite phase shifter 14 adjusts the compensation signal based on an integration signal generated by integration circuit 26.

According to the characteristics of the orthogonal cross-polarization interference compensating device of this exemplary embodiment, control circuit 23 determines whether or not orthogonal cross-polarization interference is present based on the compensation signal adjusted by infinite phase shifter 14, and if no orthogonal cross-polarization interference is present, adjusts the integration signal, generated by integration circuit 26, to a predetermined value. The predetermined value is 0 or a value in the vicinity of 0. More specifically, the predetermined value is in the range having a width±0.05% of a full scale of an integration value with respect to 0.

In the first exemplary embodiment, control signal 23 sets the integration signal to a predetermined value by adding a faint signal, which has polarity and inverse polarity of the integration signal, to the integration signal. Meanwhile, in the following second exemplary embodiment, control circuit 36 reduces the integration signal until it has a predetermined value. In the following third exemplary embodiment, control circuit 23 resets the integration signal to a predetermined value.

Below, a detailed description will be given of co-channel transmission.

Referring to FIG. 2, multipliers 1 and 1', local oscillators 2 and 2', and antennas 3 and 3' are included in a transmitting station. In addition, multipliers 5, 5', 8, 8', 10 and 10', local oscillators 6 and 6', reference oscillator 7, oscillators 9 and 9', demodulators 11 and 11', orthogonal cross-polarization interference compensators 12 and 12', phase correctors 13 and 13', and infinite phase shifters 14 and 14' are included in a receiving station.

In the transmitting station, two intermediate frequency (IF) signals are input to multipliers 1 and 1', respectively. Multiplier 1 generates a radio frequency (RF) signal by mixing the input IF signal with a local signal generated by local oscillator 2. Multiplier 1 transmits the RF signal via antenna 3 as a V polarization signal. Multiplier 1' generates an RF signal by mixing the input IF signal with a local signal generated by local oscillator 2'. Multiplier 1' transmits the RF signal via antenna 3' as an H polarization signal.

Meanwhile, actually one antenna is used even if two antennas are shown in FIG. 2 for the purpose of easy explanation. That is, both the V polarization signal and the H polarization signal are transmitted via one antenna.

Antennas 4 and 4' of the receiving station receive the RF signals from the transmitting station. Meanwhile, actually one antenna is used in the receiving station as in the transmitting station even if two antennas are shown for the purpose of easy explanation. That is, both the V polarization signal and the H polarization signal are received via one antenna.

The V polarization signal received in antenna 4 is input to multiplier 5, and the H polarization signal received in antenna 4' is input to multiplier 5'.

Multiplier 5 generates a V polarization IF signal by mixing the V polarization signal with a local signal generated by local oscillator 6. Multiplier 5' generates an H polarization IF signal by mixing the H polarization signal with a local signal generated by local oscillator 6'. In this case, reference oscillator 7 is connected with local oscillators 6 and 6'. Respective frequencies of the local signals generated by the local oscillators 6 and 6' are synchronous with each other by a low frequency reference signal generated by reference oscillator.

Both multipliers 5 and 5' input the IP signals to both a V polarization demodulating device and an H polarization demodulating device.

The V polarization demodulating device includes multipliers 8 and 10, oscillator 9, demodulator 11, orthogonal cross-polarization interference compensator 12, phase corrector 13, and infinite phase shifter 14. Meanwhile, the H polarization demodulating device includes multipliers 8' and 10', oscillator 9', demodulator 11', orthogonal cross-polarization interference compensator 12', phase corrector 13', and infinite phase shifter 14'

Since the two demodulating devices are configured substantially the same, the configuration of the V polarization demodulating device will be described hereinafter as an example.

The IF signal generated by multiplier 5 is input as an own polarization IF signal to multiplier 8, and the IF signal generated by multiplier 5' is input as other polarization IF signal to multiplier 10.

Multipliers 8 and 10 are connected with oscillator 9. Multiplier 8 generates an own polarization baseband signal by mixing the own polarization IF signal with a local signal generated by oscillator 9. In addition, multiplier 10 generates other polarization baseband signal by mixing other polarization IF signal with a local signal generated by oscillator 9.

In this exemplary embodiment, it shall be assumed that sub-synchronous detection is used as a detection method. For this reason, carrier synchronization of a baseband signal is not established at this time point but will be established by demodulator 11 on the rear point.

Multiplier 8 inputs the own polarization baseband signal as own polarization signal to demodulator 11. Demodulator 11 establishes carrier synchronization and clock synchronization of the own polarization signal. In addition, demodulator 11 performs intersymbol interference equalization on the own polarization signal if necessary.

Demodulator 11 outputs the own polarization signal, on which intersymbol interference equalization is performed, as a demodulation signal indicating the demodulation result of the V polarization signal.

Meanwhile, multiplier 10 inputs the other polarization baseband signal as a polarization signal to orthogonal cross-polarization interference compensator 12. Based on the polarization signal, orthogonal cross-polarization interference compensator 12 generates a compensation signal for removing a polarization signal component, which interferes with the own polarization signal. The compensation signal generated from orthogonal cross-polarization interference compensator 12 is input to infinite phase shifter 14. Infinite phase shifter 14 also receives the compensation signal generated from phase corrector 13. Infinite phase shifter 14 adjusts the compensation signal by rotating the phase of the compensation signal based on the phase correction signal.

Phase corrector 13 receives a phase rotation signal for establishing carrier synchronization and a demodulation signal from demodulator 11, and receives the compensation signal from infinite phase shifter 14. Phase corrector 13 generates a phase correction signal from these signals, and outputs the phase correction signal to infinite phase shifter 14.

Below, with reference to FIG. 3, a more detailed description will be given of the orthogonal cross-polarization interference compensating device.

Demodulator 11 includes complex number multiplier 15, adder 16, carrier phase detector 17, loop filter 18, accumulator 19, read-only memory (ROM) 20. Phase corrector 13 includes error detector 21, phase noise-phase detector 22, control circuit 23, multipliers 24 and 25, integration circuit 26, adders 27 and 29, and accumulator 28. In addition, infinite phase shifter 14 includes complex number multiplier 15' and ROM 20'.

Complex number multiplier 15 rotates the carrier phase of the own polarization signal by multiplying the own polarization signal input from multiplier 8 with the local signal generated by ROM 20. Adder 16 compensates the orthogonal cross-polarization interference of the other polarization signal for the own polarization baseband signal by adding the compensation signal output from infinite phase shifter 14 to the own polarization baseband signal, the carrier phase of which is rotated by complex number multiplier 15. Adder 16 outputs the compensated own polarization signal as a demodulation signal.

The demodulation signal output from adder 16 is input to carrier phase detector 17. Carrier phase detector 17 detects any lag or advance of the carrier phase of the demodulation signal. Loop filter 18 removes a high frequency component from the detection result of carrier phase detector 17.

An output signal of loop filter 18 is input to accumulator 19. Accumulator 19 converts the output signal of loop filter 18 into an angle signal by performing integration (i.e., cumulative addition) on the output signal. Accumulator 19 outputs the angle signal to ROM 20.

ROM 20 previously stores sine and cosine values according to angle signals. In addition, ROM 20 calculates sine and cosine values according to the angle signal input from accumulator 19, and outputs the calculated sine and cosine values as a local signal to complex number multiplier 15.

In this case, the control loop including complex number multiplier 15, carrier phase detector 17, loop filter 18, accumulator 19, and ROM 20 composes a carrier recovery phase locked loop (PLL) circuit.

Orthogonal cross-polarization interference compensator 12 generates a compensation signal based on the other polarization signal (i.e., other polarization input) output from adder 10.

The compensation signal output from orthogonal cross-polarization interference compensator 12 and the local signal output from ROM 20' are input to complex number multiplier 15'. Complex number multiplier 15' performs addition on the complex numbers of the compensation signal and the local signal. The output signal from the complex number multiplier 15' is input to adder 16, phase nose-phase detector 22, and control circuit 23.

Error detector 21 detects a difference between the demodulation signal output from adder 16 and a proper signal point (i.e., a quadrature amplitude modulation (QAM) lattice point). Error detector 21 generates the result of detection as an error signal indicating a phase difference between the demodulation signal and a proper demodulation signal. Error detector 21 outputs the error signal to phase nose-phase detector 22.

Phase nose-phase detector 22 compares the error signal output from error detector 21 and the compensation signal output from infinite phase shifter 14, and calculates a phase difference between these signals. Phase nose-phase detector 22 outputs a phase angle signal indicating the phase difference to a second loop filter including multiplier 24, multiplier 25, integration circuit 26, and adder 27.

Figure 4:
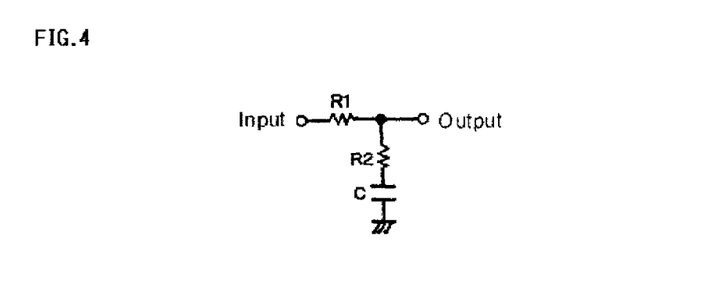
FIG. 4 is a circuit diagram illustrating a lag-lead filter.

The second loop filter functions as a loop filter of a control loop including adder 16, phase corrector 13, and infinite phase shifter 14. The loop filter is realized by constructing an analog circuit called a lag-lead filter as shown in FIG. 4 using a digital circuit.

Multiplier 24 adds adjustment signal a to the phase angle signal output from phase nose-phase detector 22. In addition, multiplier 24 adds adjustment signal 13 to the phase angle signal output from phase nose-phase detector 22. When it used the resistance and capacity of the lag-lead filter shown in FIG. 4, adjustment signal α is expressed by Equation 1 below and adjustment signal 13 is expressed by Equation 2 below.

$$\alpha = \frac{1}{R_1 C} \cdot \frac{1}{f_s} \quad \text{[Equation 1]}$$

$$\beta = \frac{R_2}{R_1} \cdot \frac{1}{f_s} \quad \text{[Equation 2]}$$

Here, $f_s$ indicates a symbol frequency of a QAM modulation wave. The input and output characteristics of the loop filter are determined based on adjustment signals α and β.

Integration circuit 26 performs integration (i.e., cumulative addition) on the output signal from multiplier 24, and outputs an integration signal indicating the result of integration to adder 27.

Figure 5:
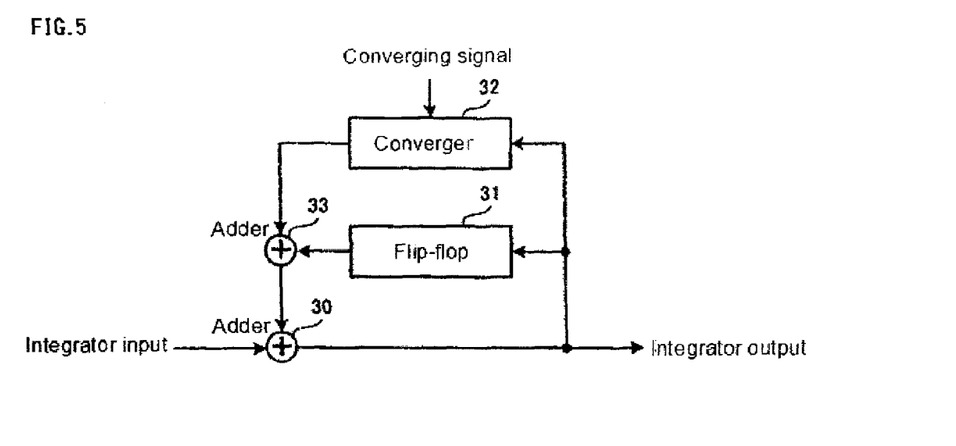
FIG. 5 is a block diagram illustrating the configuration of a control circuit in accordance with the first exemplary embodiment of the invention.

FIG. 5 is a block diagram illustrating an exemplary configuration of the integration circuit. Referring to FIG. 5, integration circuit 26 includes adder 30, flip-flop 31, converger 32, and adder 33.

Adder 30 generates a new integration signal by adding an integration signal stored in flip-flop 31 with a signal input from multiplier 24. In addition, flip-flop 31 stores the integration signal generated by adder 30.

When a convergence signal input from control circuit 23 indicates a converging operation, converger 32 adjusts the integration signal output from flip-flop 31 to a predetermined value based on the polarity of the convergence signal.

More specifically, converger 32 monitors the integration signal output from adder 30, and outputs a faint signal, that has the polarity and inverse polarity of the integration signal, to adder 33. Adder 33 adjusts the integration signal output from flip-flop 31 to a predetermined value by adding the faint signal to the integration signal.

The amplitude of the faint signal is set to be small so that it does not influence the compensation of orthogonal polarization signal interference. For example, the amplitude of the faint signal is about 1/100 of adjustment signal α or β.

Returning to FIG. 3, adder 27 adds the output signal of integration circuit 26 with the output signal of multiplier 25, and outputs a signal indicating the result of addition. Accumulator 28 generates an angle signal by performing integration (i.e., cumulative addition) on the output signal of adder 27, and outputs the angle signal to adder 29.

Adder 29 adds the angle signals output from accumulators 19 and 28, and outputs the result of addition to infinite phase shifter 14

Figure 6:
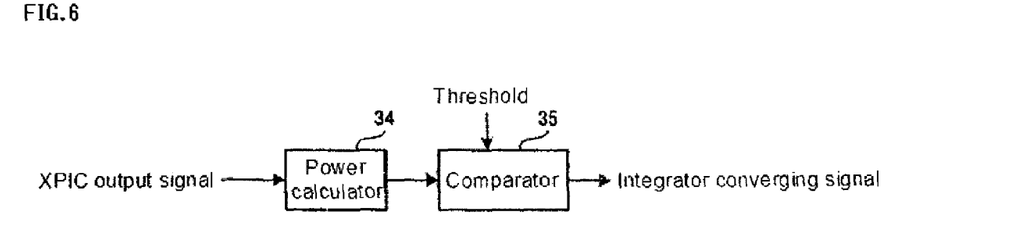
FIG. 6 is a block diagram illustrating the configuration of an integrating circuit in accordance with the first exemplary embodiment of the invention.

FIG. 6 is a block diagram illustrating an exemplary configuration of control circuit 23. Referring to FIG. 6, control circuit 23 includes power calculator 34 and comparator 35.

Power calculator 34 receives a compensation signal (i.e., an XPIC output signal) output from infinite phase shifter 14. Power calculator 34 calculates the power of the compensation signal, and outputs a power signal indicating the calculated power to comparator 35. In this case, the power of the compensation signal reflects the amount of orthogonal cross-polarization interference.

Comparator 35 compares the power indicated by the power signal with a preset threshold. Comparator 35 determines that orthogonal cross-polarization interference is present if the power is at least the threshold but no orthogonal cross-polarization interference is present if the power is below the threshold.

If no orthogonal cross-polarization interference is present, comparator 35 outputs a converging signal indicating a converging operation to integration circuit 26 in order to adjust the integration signal generated by integration circuit to a predetermined value.

Meanwhile, if orthogonal cross-polarization interference is present, comparator 35 outputs a converging signal indicating a normal operation to integration circuit so that integration circuit 26 operates in a normal mode.

Below, the operation of the orthogonal cross-polarization interference compensating device of this exemplary embodiment will be described.

Carrier phase detector 17 inputs a phase error signal, which indicates an error between the carrier phase of a demodulation signal generated by adder 16 and the phase of a proper demodulation signal, to loop filter 18. Loop filter 18 removes a high frequency component from the phase error signal and converts the phase error signal to a frequency signal.

If carrier phase detector 17 determines that a phase is advancing, the phase rotation speed of the frequency signal in complex number multiplier 15 is adjusted in the direction delaying a carrier phase (i.e., delaying a frequency). Thereby, carrier synchronization is established.

Orthogonal cross-polarization interference compensator 12 generates a compensation signal, which compensates for other polarization signal component that interferes with own polarization signal, based on other polarization signal. The operation of orthogonal cross-polarization interference compensator 12 is disclosed in, for example, Patent Document 1, and a detailed description thereof will be omitted.

Error detector 21 detects an error vector between a signal point of a demodulation signal generated by adder 16 and a signal point of a proper demodulation signal. Phase nose-phase detector 22 calculates an angle difference between the error vector detected by error detector 21 and an orthogonal cross-polarization interference signal input from complex number multiplier 15', and outputs a differential signal indicating the angle difference. The differential signal reflects a phase noise difference between the own polarization signal and other polarization signals.

The loop filter including multipliers 24 and 25, integration circuit 26, and adder 27 removes a high frequency component from the differential signal output from phase nose-phase detector 22. The signal, from which the high frequency signal is removed, is converted into a phase correction angle by accumulator 28. In addition, ROM 20' and complex number multiplier 15' rotate the phase of a compensation signal, output from orthogonal cross-polarization interference compensator 12, according to the phase correction angle. This, as a result, reduces a phase difference due to phase noise, which carrier components of the own polarization signal and the orthogonal cross-polarization interference compensation signal have.

Control circuit 23 calculates the power of the compensation signal output from orthogonal cross-polarization interference compensator, and if the power is smaller than a threshold, determines that no orthogonal cross-polarization interference is present. If it is determined that no orthogonal cross-polarization interference is present, control circuit 23 outputs a converging signal for maintaining an integration signal generated by integration circuit 26 at a predetermined value and converges the value of the integration signal (hereinafter, also referred to as an integrated value) output from integration circuit 26 to a predetermined value. This, as a result, makes it possible to prevent the value of integration circuit 26 from being indefinite when no orthogonal cross-polarization interference is present. Accordingly, it is possible to improve compensation characteristics due to the second control loop while ensuring stability.

Next, the effects will be described.

According to the configuration of the related art, since the control loop is constructed with a first control loop, a normal phase error depending on a loop gain occurs due to phase noise if a carrier frequency difference is present between an own polarization signal and other polarization signals. As a result, if a great amount of orthogonal cross-polarization interference is present, the vector direction of an interfering component of the own polarization signal is not consistent with that of a compensation signal. Accordingly, an interfering component, which is not completely compensated, exists when a difference in carrier frequencies is present.

When the control loop is constructed with a second loop, the normal phase error can be suppressed even if the carrier frequency difference is present. For this reason, even if the carrier frequency difference occurs due to phase noise between the own polarization signal and the other polarization signals, the vector direction of the interfering component can be set to be consistent with that of the compensation signal, thereby preventing compensation characteristics from degrading.

In this case, a problem still exists. If no orthogonal cross-polarization interference is present, orthogonal cross-polarization interference compensator 12 does not output anything. In addition, an error signal output from error detector 21 does not depend on the other polarization signals. Then, the control loop is broken, and a value, which integration circuit 26 maintains, is not set to be unique.

Even if integration circuit 26 is outputting a large value as a value of an integration signal, the integration signal does not influence the quality of a demodulation signal if no orthogonal cross-polarization interference is present. However, if orthogonal cross-polarization interference is present and compensation for the orthogonal cross-polarization interference is required, a compensation signal output from orthogonal cross-polarization interference compensator 12 undergoes intense phase rotation in infinite phase shifter 14 according to the large value that integration circuit 26 maintains. Accordingly, a proper compensation effect is not obtained.

In this exemplary embodiment, the value of integration circuit 26 is converted to the vicinity of 0 when no orthogonal cross-polarization interference is present. As a result, integration circuit 26 does not increase even if no orthogonal cross-polarization interference is present. In addition, when orthogonal cross-polarization interference is present, the converging operation of integration circuit 26 is disabled according to the power of the output signal of orthogonal cross-polarization interference compensator 12. Accordingly, even if a great amount of orthogonal cross-polarization interference is present, the orthogonal cross-polarization interference can be correctly compensated for.

Figure 7:
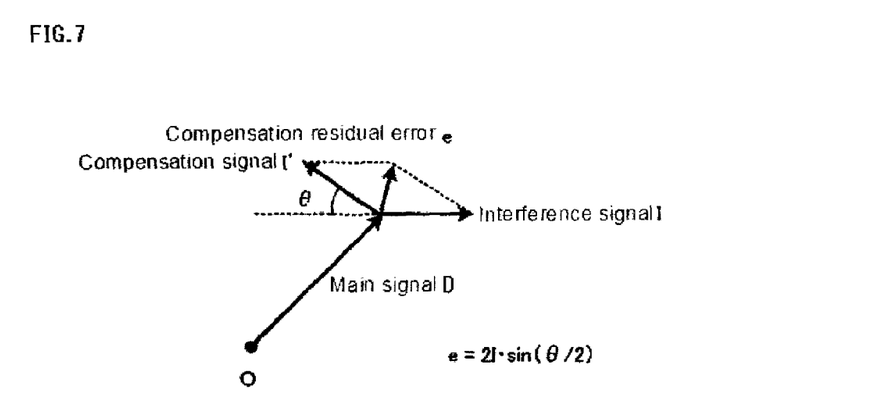
FIG. 7 is a configuration view illustrating influence on a main signal by stopping the integration circuit when a small amount of interference is present.

With reference to FIG. 7, a description will be given of the influence on an own polarization signal by stopping integration circuit 26 when a small amount of interference is present. The own polarization signal is indicated with D vector, an interference wave of orthogonal cross-polarization interference is indicated with I vector, and a compensation signal generated by orthogonal cross-polarization interference compensator 12 is indicated with I' vector. When orthogonal cross-polarization interference is completely compensated for, θ in FIG. 7 is 0, and the I and I' vectors reduce each other, so that only the D vector indicating the own polarization signal remains.

If phase noise is present in both local oscillators 6 and 6' and if phase rotation exceeds the phase-tracking ability of interference compensator 12, θ is a value rather than 0. A phase error occurring at this time is expressed by 2I·sin(θ/2) if the I vector and the I' vector are assumed to have the same size. In other words, if θ is smaller than π/3, a compensation error is smaller than the value of the I vector.

In practice, even if integration circuit 26 is stopped, the first control loop performs control to reduce θ and orthogonal cross-polarization interference compensator 12 operates to reduce θ more or less. Accordingly, it is little probable that θ can become a large value, and the compensation characteristics of orthogonal cross-polarization interference compensator 12 will rarely degrade.

If the threshold (i.e., a threshold used in the case of phase correction) of comparator 35 of control circuit 23 is set to a sufficiently small valve (e.g., 3% of a signal point interval) with respect to a signal point interval determined by modulation mode, phase correction can be started before an interference wave increases to a size that is not negligible with respect to the signal point interval. Accordingly, there is possibility to stably use the second control loop without degrading the compensation characteristics of orthogonal cross-polarization interference compensator 12.

Meanwhile, this exemplary embodiment is assumed to use reference synchronization. Accordingly, the own polarization signal and the other polarization signals undergo frequency synchronization, and thus integration circuit 26 maintains an integration value in the vicinity of 0 even if control circuit 23 is operating. Even if integration circuit 26 maintains the integration value in the vicinity of 0 with a small amount of interference, when interference with a polarization signal occurs, integration circuit 26 can maintain a value in the vicinity of the difference between the own polarization signal and the other polarization signals. Accordingly, smooth correction can be started even if interference occurs between polarization signals.

Second Exemplary Embodiment

Figure 8:
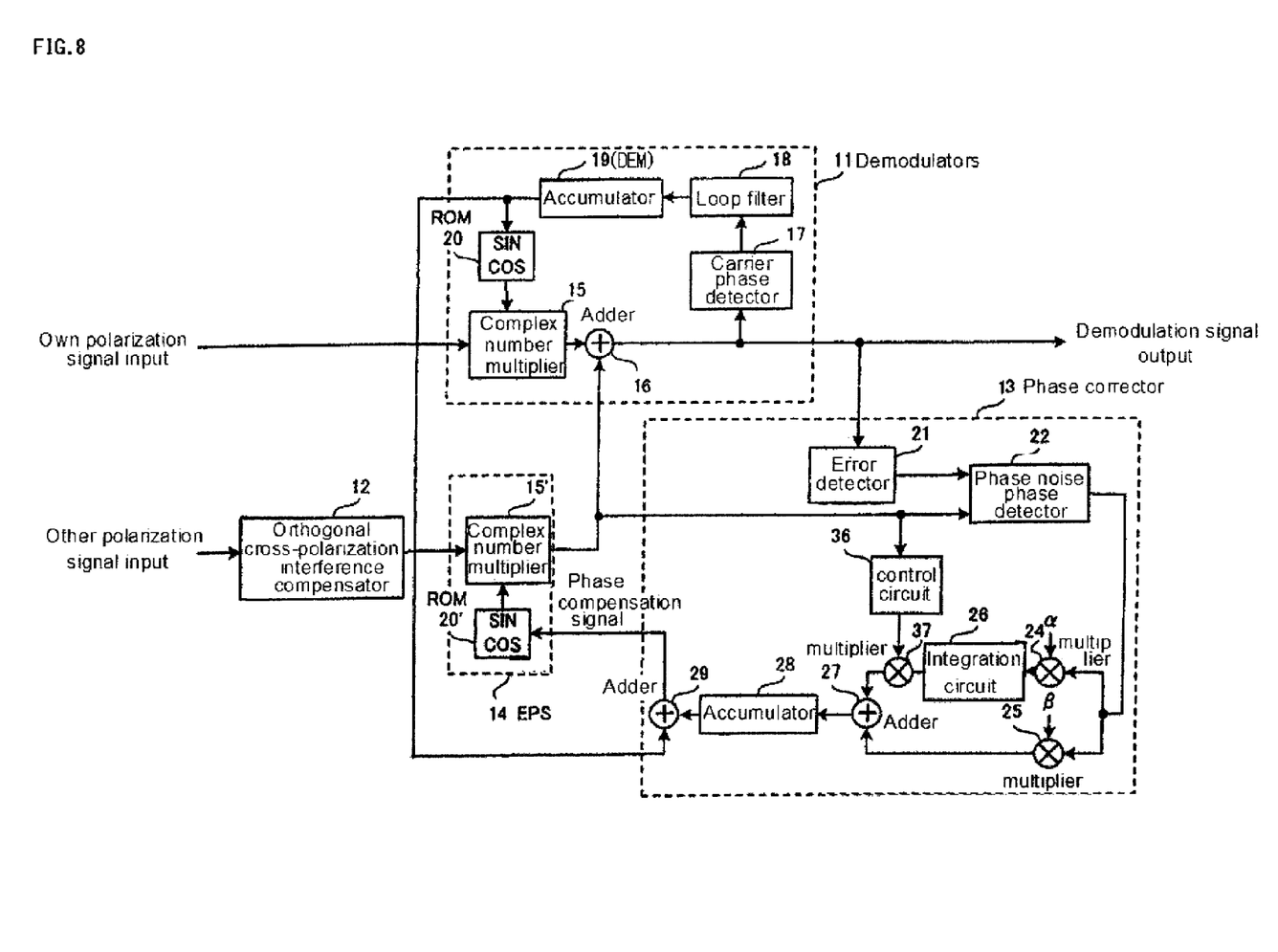
FIG. 8 is a block diagram illustrating the configuration of an orthogonal cross-polarization interference compensating device in accordance with a second exemplary embodiment of the invention.

In accordance with this exemplary embodiment, integration circuit 26 reduces a gain of its output when a small amount of orthogonal cross-polarization interference is present. FIG. 8 is a block diagram illustrating the configuration of orthogonal cross-polarization interference compensating device in accordance with this exemplary embodiment.

Referring to FIG. 8, orthogonal cross-polarization interference compensating device further includes multiplier 37 in addition to the configuration shown in FIG. 3. In addition, orthogonal cross-polarization interference compensating device includes control circuit 36 in place of control circuit 23.

Control circuit 36 determines whether or not orthogonal cross-polarization interference is present based on a compensation signal adjusted by infinite phase shifter 14, and if no orthogonal cross-polarization interference is present, reduces an integration signal output from integration circuit 26 to a predetermined value.

Figure 9:
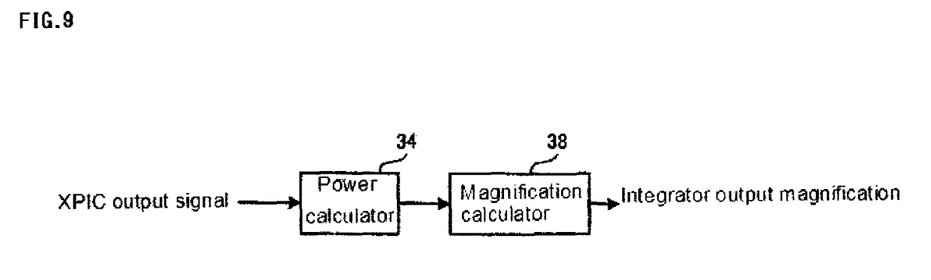
FIG. 9 is a block diagram illustrating the configuration of a control circuit according to the second exemplary embodiment of the invention.

FIG. 9 is a block diagram illustrating the configuration of control circuit 36. Referring to FIG. 9, control circuit 36 includes power calculator 34 and magnification calculator 38.

Power calculator 34 calculates the power of a compensation signal output from orthogonal cross-polarization interference compensator 12 and inputs a power signal indicating the calculated power to magnification calculator 38. Magnification calculator 38 determines the magnification of multiplier 37 based on the power signal and determines a ratio of reflection with respect to accumulator 28, which accumulates the integration signal output from integration circuit 26.

Specifically, magnification calculator 38 sets the ratio of reflection to 0 by setting magnification to 0 when the value of the power signal is 0, that is, no output from orthogonal cross-polarization interference compensator 12 is present. If the value of the power signal is not 0, that is, if an output from orthogonal cross-polarization interference compensator 12 is present, magnification calculator 38 determines the ratio of reflection by changing magnification according to the value of the power signal. More specifically, magnification calculator 38 increases magnification as the value of the power signal is, that is, the amount of orthogonal cross-polarization interference increases. Meanwhile, the relationship between the value of the power signal and the magnification of multiplier 37 is, for example, proportional. However, this relationship can be properly changed according to the characteristics of phase corrector 13.

Meanwhile, control circuit 36 outputs a magnification signal, which indicates determined magnification, to multiplier 37. Multiplier 37 changes the ratio of reflection of an output signal with respect to accumulator 28 by changing the gain of the output signal of integration circuit 26 by multiplying the output signal of integration circuit 26 with the magnification signal output from control signal 36.

If no orthogonal cross-polarization interference is present, the magnification of multiplier 37 is small since the output signal of orthogonal cross-polarization interference compensator 12 is small. For this reason, a very small amount of phase correction is present irrespective of a value that integration circuit 26 maintains. If orthogonal cross-polarization interference is present and the value of the output signal of orthogonal cross-polarization interference compensator 12 increases, the magnification of multiplier 37 increases and the control loop using integration circuit is established.

However, at this time point, the output signal has a small influence on the orthogonal cross-polarization interference compensating device a large amount of since the integration signal output from integration circuit 26 is reduced. Since the magnification signal according to the value of the current integration signal is input to integration circuit 26, the amount of the integration signal that is being reduced gradually decreases and converges to the vicinity of 0. Accordingly, the second control loop can show sufficient compensation characteristics with time lapse.

Therefore, if no orthogonal cross-polarization interference is present, the value of integration that integration circuit maintains 26 reduces to predetermined value. This, as a result, makes it possible to prevent the value of the integration signal, generated by integration circuit 26, from being indefinite.

Third Exemplary Embodiment

In accordance with this exemplary embodiment, the value of an integration signal output from integration circuit 26 is reset if a small amount of orthogonal cross-polarization interference is present. The configuration of the orthogonal cross-polarization interference compensating device is substantially the same as that shown in FIG. 2 except for the internal configuration of integration circuit 26.

Figure 10:
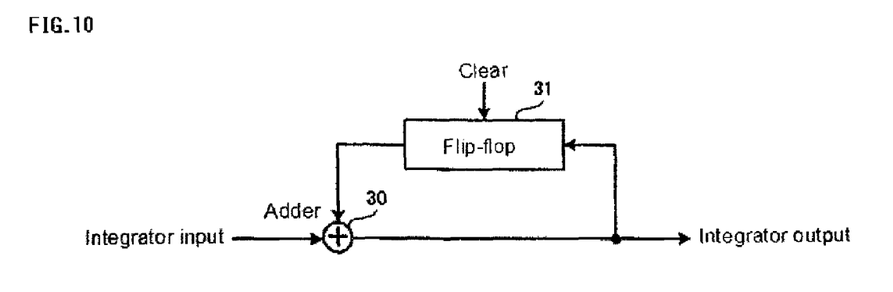
FIG. 10 is a block diagram illustrating the configuration of an integrating circuit in accordance with a third exemplary embodiment of the invention.

FIG. 10 is a block diagram illustrating the configuration of integrating circuit 26 in accordance with the second exemplary embodiment of the invention. Referring to FIG. 10, integration circuit 26 includes adder 30 and flip-flop 31.

Control circuit 23 clears the value of the integration signal by clearing a value maintained by flip-flop 31 to a predetermined value if no orthogonal cross-polarization interference is present. Meanwhile, control circuit 23 can use a converging signal, which indicates a converging operation previously described in the first exemplary embodiment, as a clear signal for clearing the value of the integration signal.

In addition, control circuit 23 disables clearing of the integration signal if orthogonal cross-polarization interference is present. Meanwhile, control circuit 23 can use a converging signal, which indicates a normal operation previously described in the first exemplary embodiment, as a clear disable signal for disabling clearing of the integration signal.

Accordingly, if no orthogonal cross-polarization interference is present, the value of integration maintained by integration circuit 26 is cleared. This, as a result, makes it possible to prevent the value of the integration signal, generated by integration circuit 26, from being indefinite.

The present application claims priority from Japanese Patent Application Number 2007-103900, filed Apr. 11, 2007, the disclosure of which is hereby incorporated by reference herein in its entirety.

Industrial Applicability

As set forth above, the invention can provide a orthogonal cross-polarization is interference compensating device having excellent performance, which can be used to improve communication qualities in wireless communication devices (e.g., fixed microwave communication devices) using a co-channel transmission mode.

What is claimed is:

1. An orthogonal cross-polarization interference compensating device, which compensates for orthogonal cross-polarization interference of other polarization signals with an own polarization signal, comprising: a compensator that generates a compensation signal for compensating phase noise included in the own polarization signal; a demodulator that compensates for the orthogonal cross-polarization interference of the other polarization signals with the own polarization signal by suppressing phase noise included in the own polarization signal based on the compensation signal; an error detector that generates an error signal indicating phase difference between the own polarization signal compensated by the demodulator and a proper own polarization signal; a phase detector that generates a differential signal indicating phase difference between the own polarization signal and the other polarization signals based on the compensation signal and the error signal; an integrator that generates an integration signal by integrating the differential signal generated by phase detector; a shifter that adjusts the compensation signal based on the integration signal generated by the integrator; and a controller that determines whether or not the orthogonal cross-polarization interference is present based on the compensation signal adjusted by the shifter, and if no orthogonal cross-polarization interference is present, adjusts an integration value indicated by the integration signal to a predetermined value.

2. The orthogonal cross-polarization interference compensating device of claim 1, wherein the controller sets the integration signal to the predetermined value by adding a faint signal, which has polarity and inverse polarity of the integration signal, to the integration signal if no orthogonal cross-polarization interference is present.

3. The orthogonal cross-polarization interference compensating device of claim 1, wherein the controller reduces the integration signal to the predetermined value if no orthogonal cross-polarization interference is present.

4. The orthogonal cross-polarization interference compensating device of claim 1, wherein the controller resets the integration signal to the predetermined value if no orthogonal cross-polarization interference is present.

5. A demodulator comprising: an orthogonal cross-polarization interference compensating device described in claim 1; a first oscillator that generates a first local signal; a first multiplier that generates an own polarization baseband signal by mixing the first local signal, generated by the first oscillator, with an own polarization signal intermediate signal and inputting the own polarization baseband signal, as the own polarization signal, to the orthogonal cross-polarization interference compensating device; and a second multiplier that generates other polarization baseband signals by mixing the first local signal, generated by the first oscillator, with other polarization intermediate frequency signals and inputting the other polarization baseband signals, as the other polarization signals, to the orthogonal cross-polarization interference compensating device.

6. A receiving station comprising: a demodulator described in claim 5;
a reference oscillator that generates a reference signal; a second oscillator that generates a second local signal synchronous with the reference signal generated by the reference oscillator; a third oscillator that generates a third local signal synchronous with the reference signal generated by the reference oscillator; a third multiplier that generates the own polarization intermediate frequency signal by mixing the second local signal, generated by the second oscillator, with an own polarization radio frequency signal; and a forth multiplier that generates the other polarization intermediate frequency signals by mixing the third local signal, generated by the third oscillator, with other polarization radio frequency signals.

7. A method of compensating for orthogonal cross-polarization interference, which compensates for orthogonal cross-polarization interference of other polarization signals with an own polarization signal, the method comprising: generating a compensation signal for compensating phase noise included in the own polarization signal; compensating the orthogonal cross-polarization interference of the other polarization signals with the own polarization signal by suppressing phase noise included in the own polarization signal based on the compensation signal; generating an error signal indicating phase difference between the compensated own polarization signal and a proper own polarization signal; generating a differential signal indicating phase difference between the own polarization signal and the other polarization signals based on the compensation signal and the error signal; generating an integration signal by integrating the generated differential signal; adjusting the compensation signal based on the generated integration signal; and determining whether or not the orthogonal cross-polarization interference is present based on the adjusted compensation signal, and if no orthogonal cross-polarization interference is present, adjusting an integration value indicated by the integration signal to a predetermined value.

8. The method of claim 7, comprising setting the integration signal to the predetermined value by adding a faint signal, which has polarity and inverse polarity of the integration signal, to the integration signal if no orthogonal cross-polarization interference is present.

9. The method of claim 7, comprising reducing the integration signal to the predetermined value if no orthogonal cross-polarization interference is present.

10. The method of claim 7, comprising resetting the integration signal to the predetermined value if no orthogonal cross-polarization interference is present.

11. A demodulator comprising: an orthogonal cross-polarization interference compensating device described in claim 2; a first oscillator that generates a first local signal; a first multiplier that generates an own polarization baseband signal by mixing the first local signal, generated by the first oscillator, with an own polarization signal intermediate signal and inputting the own polarization baseband signal, as the own polarization signal, to the orthogonal cross-polarization interference compensating device; and a second multiplier that generates other polarization baseband signals by mixing the first local signal, generated by the first oscillator, with other polarization intermediate frequency signals and inputting the other polarization baseband signals, as the other polarization signals, to the orthogonal cross-polarization interference compensating device.

12. A demodulator comprising: an orthogonal cross-polarization interference compensating device described in claim 3; a first oscillator that generates a first local signal; a first multiplier that generates an own polarization baseband signal by mixing the first local signal, generated by the first oscillator, with an own polarization signal intermediate signal and inputting the own polarization baseband signal, as the own polarization signal, to the orthogonal cross-polarization interference compensating device; and a second multiplier that generates other polarization baseband signals by mixing the first local signal, generated by the first oscillator, with other polarization intermediate frequency signals and inputting the other polarization baseband signals, as the other polarization signals, to the orthogonal cross-polarization interference compensating device.

13. A demodulator comprising: an orthogonal cross-polarization interference compensating device described in claim 4; a first oscillator that generates a first local signal; a first multiplier that generates an own polarization baseband signal by mixing the first local signal, generated by the first oscillator, with an own polarization signal intermediate signal and inputting the own polarization baseband signal, as the own polarization signal, to the orthogonal cross-polarization interference compensating device; and a second multiplier that generates other polarization baseband signals by mixing the first local signal, generated by the first oscillator, with other polarization intermediate frequency signals and inputting the other polarization baseband signals, as the other polarization signals, to the orthogonal cross-polarization interference compensating device.

* * * * *